(12) United States Patent
Sevskiy et al.

(10) Patent No.: US 11,916,530 B2
(45) Date of Patent: Feb. 27, 2024

(54) ACOUSTIC-WAVE-BASED FILTER FOR WIDEBAND APPLICATIONS

(71) Applicant: RF360 SINGAPORE PTE. LTD., Singapore (SG)

(72) Inventors: Georgiy Sevskiy, Munich (DE); Mykola Shevelov, Munich (DE); Bohdan Bravichev, Munich (DE); Mathieu Pijolat, Grenoble (FR); Stefan Freisleben, Neubiberg (DE); Patric Heide, Vaterstetten (DE)

(73) Assignee: RF360 Singapore Pte. Ltd., Singapore (SG)

( * ) Notice: Subject to any disclaimer, the term of this patent is extended or adjusted under 35 U.S.C. 154(b) by 120 days.

(21) Appl. No.: 17/457,720

(22) Filed: Dec. 6, 2021

(65) Prior Publication Data

US 2023/0179168 A1    Jun. 8, 2023

(51) Int. Cl.
*H03H 9/02* (2006.01)
*H03H 9/00* (2006.01)
*H03H 9/05* (2006.01)
*H03H 9/125* (2006.01)

(52) U.S. Cl.
CPC ...... *H03H 9/02007* (2013.01); *H03H 9/0014* (2013.01); *H03H 9/0504* (2013.01); *H03H 9/125* (2013.01)

(58) Field of Classification Search
CPC .............. H03H 7/0115; H03H 7/1775; H03H 2009/0019; H03H 9/02007; H03H 9/0014
USPC .................................................. 333/175, 193
See application file for complete search history.

(56) References Cited

U.S. PATENT DOCUMENTS

| 3,460,073 | A | 8/1969 | Thelen |
| 4,939,779 | A | 7/1990 | Hitchcock |
| 2006/0145782 | A1* | 7/2006 | Liu ........................ H03H 7/463 333/132 |
| 2009/0128260 | A1* | 5/2009 | Block .................... H03H 9/568 333/187 |
| 2021/0265979 | A1 | 8/2021 | Inoue et al. |

FOREIGN PATENT DOCUMENTS

| CN | 209330078 U | 8/2019 |
| JP | 2006014377 A | 1/2006 |

OTHER PUBLICATIONS

International Search Report and Written Opinion—PCT/EP2022/081132—ISA/EPO—dated Feb. 28, 2023.

* cited by examiner

*Primary Examiner* — Rakesh B Patel
(74) *Attorney, Agent, or Firm* — Patterson+Sheridan LLP

(57) ABSTRACT

Certain aspects of the present disclosure provide a filter circuit and techniques for filtering using the filter circuit. The filter circuit generally includes a first filter stage having a first acoustic wave resonator coupled in a series path between a first port of the filter circuit and a second port of the filter circuit, a first inductor-capacitor (LC) tank circuit, a first capacitor coupled between a first terminal of the first acoustic wave resonator and the first LC tank circuit, the first LC tank circuit being coupled between the first capacitor and a reference potential node, and a second capacitor coupled between a second terminal of the first acoustic wave resonator and the first LC tank circuit. In some aspects, the filter circuit includes one or more other filter stages coupled to the first filter stage.

26 Claims, 10 Drawing Sheets

Frequency (MHz)

ACOUSTIC-WAVE-BASED FILTER FOR WIDEBAND APPLICATIONS

TECHNICAL FIELD

Certain aspects of the present disclosure generally relate to electronic components and, more particularly, a radio frequency (RF) filter.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system or a New Radio (NR) system).

Wireless communication transceivers used in these electronic devices generally include multiple radio frequency (RF) filters for filtering a signal for a particular frequency or range of frequencies. Electroacoustic devices (e.g., acoustic filters) are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is smaller than the wavelength of the electrical signal wave. The resulting smaller wavelength of the acoustic signal enables filtering to be performed using a smaller filter device than for an equivalent electrical device. Reducing the size of such filters is desirable. A filter circuit may incorporate acoustic elements, in addition to other components such as capacitors and inductors, to provide a specific frequency response. The acoustic elements facilitate improvements in the performance of the filter circuit.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a filter circuit. The filter circuit generally includes a first filter stage having a first acoustic wave resonator coupled in a series path between a first port of the filter circuit and a second port of the filter circuit, a first inductor-capacitor (LC) tank circuit, a first capacitor coupled between a first terminal of the first acoustic wave resonator and the first LC tank circuit, the first LC tank circuit being coupled between the first capacitor and a reference potential node, and a second capacitor coupled between a second terminal of the first acoustic wave resonator and the first LC tank circuit. In some aspects, the filter circuit includes one or more other filter stages coupled to the first filter stage.

Certain aspects of the present disclosure provide a method for filtering an input signal. The method generally includes receiving the input signal at a first port of a filter circuit, and generating a filtered version of the input signal at a second port of the filter circuit. The filter circuit may include a first filter stage having a first acoustic wave resonator coupled in a series path between a first port of the filter circuit and a second port of the filter circuit, a first LC tank circuit, a first capacitor coupled between a first terminal of the first acoustic wave resonator and the first LC tank circuit, the first LC tank circuit being coupled between the first capacitor and a reference potential node, and a second capacitor coupled between a second terminal of the first acoustic wave resonator and the first LC tank circuit. The filter circuit may also include one or more other filter stages coupled to the first filter stage.

Certain aspects of the present disclosure provide a filter circuit. The filter circuit generally includes a first filter stage comprising a first capacitor coupled in a series path between a first port of the filter circuit and a second port of the filter circuit, a first LC tank circuit, a second capacitor coupled between a first terminal of the first capacitor and the first LC tank circuit, the first LC tank circuit being coupled between the first capacitor and a reference potential node, and a third capacitor coupled between a second terminal of the first capacitor and the first LC tank circuit. The filter circuit may also include one or more other filter stages coupled to the first filter stage.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a filter circuit implemented for operation at high frequencies (e.g., such as, for example, above 4 GHz or even higher such as 8 GHz, although other frequencies are possible). The filter circuit of the present disclosure may be implemented using at least one bulk acoustic wave (BAW) resonator. Typically, it is difficult to achieve low insertion loss (IL) for a high frequency filter (e.g., 8 GHz filter) when using a BAW resonator. Certain aspects of the present disclosure provide a filter design having a BAW resonator with relatively low insertion loss as compared to other filter implementations.

Example Wireless Communications

Figure 1:
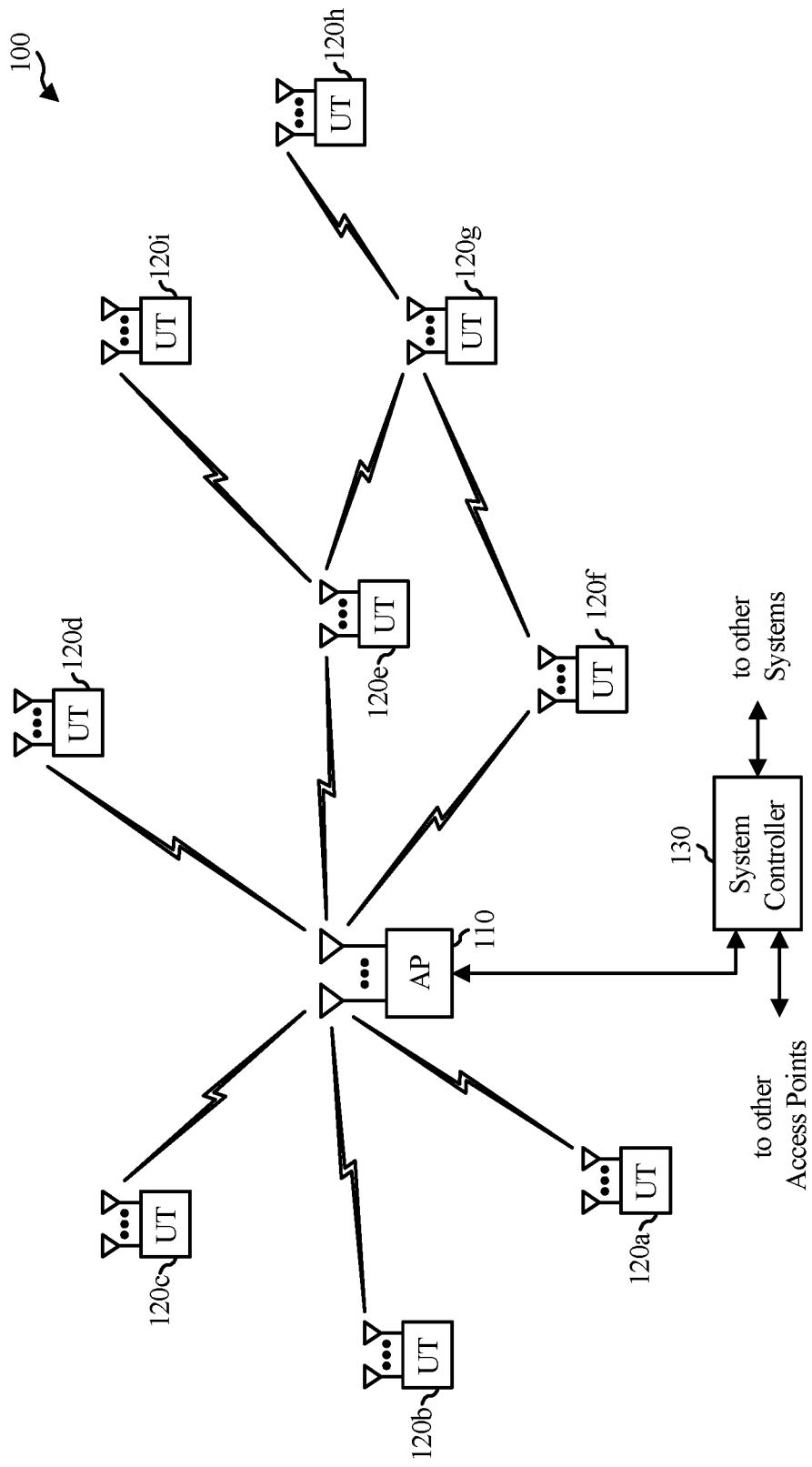
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include one or more filters 390 (e.g., forming a diplexer). The one or more filters may be implemented using an acoustic wave resonator and have a relatively low insertion loss as compared to other filter implementations, as described in more detail herein.

Figure 2:
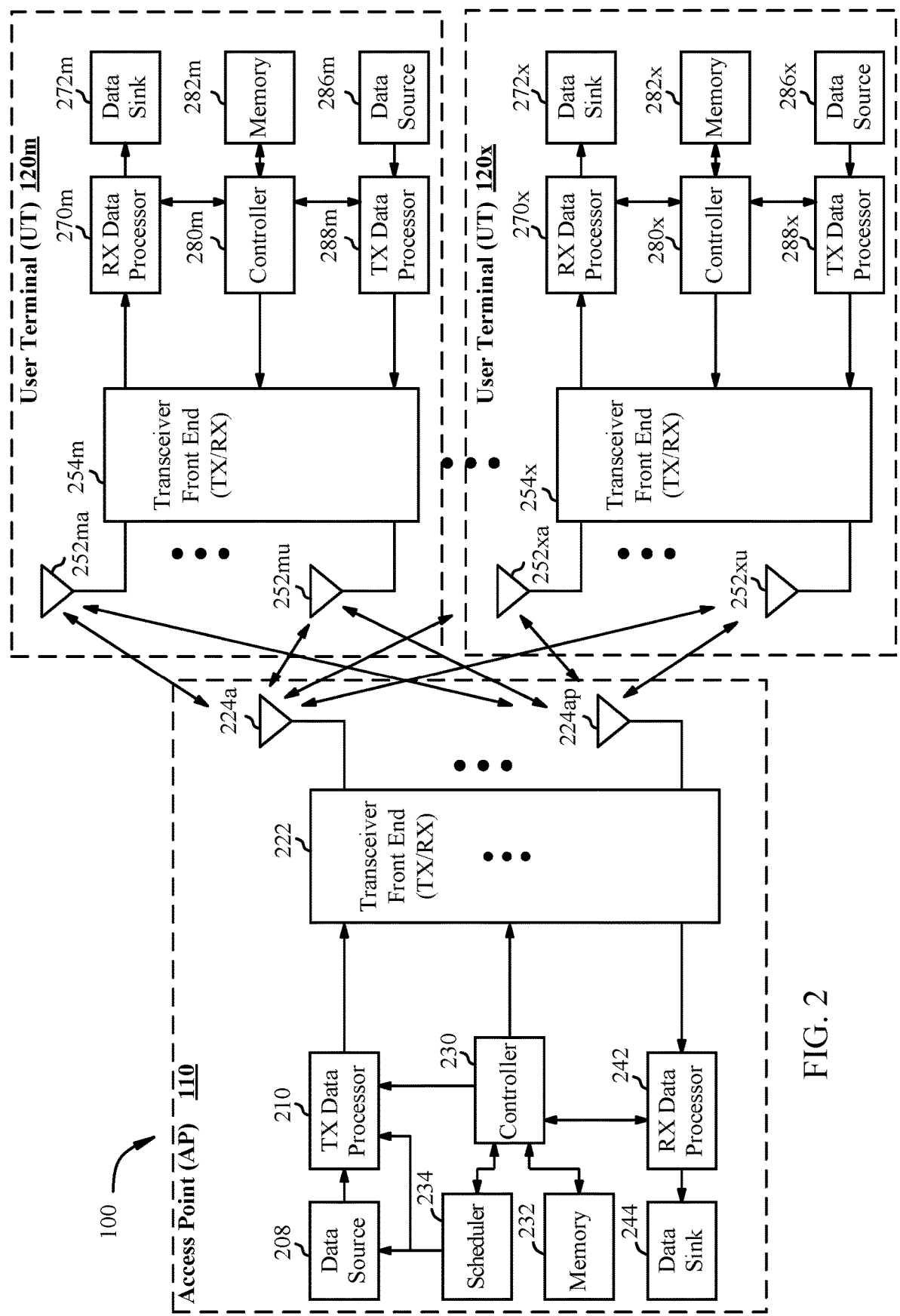
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include one or more filters 390 (e.g., forming a diplexer). The one or more filters may be implemented using an acoustic wave resonator and have a relatively low insertion loss as compared to other filter implementations, as described in more detail herein.

Figure 3:
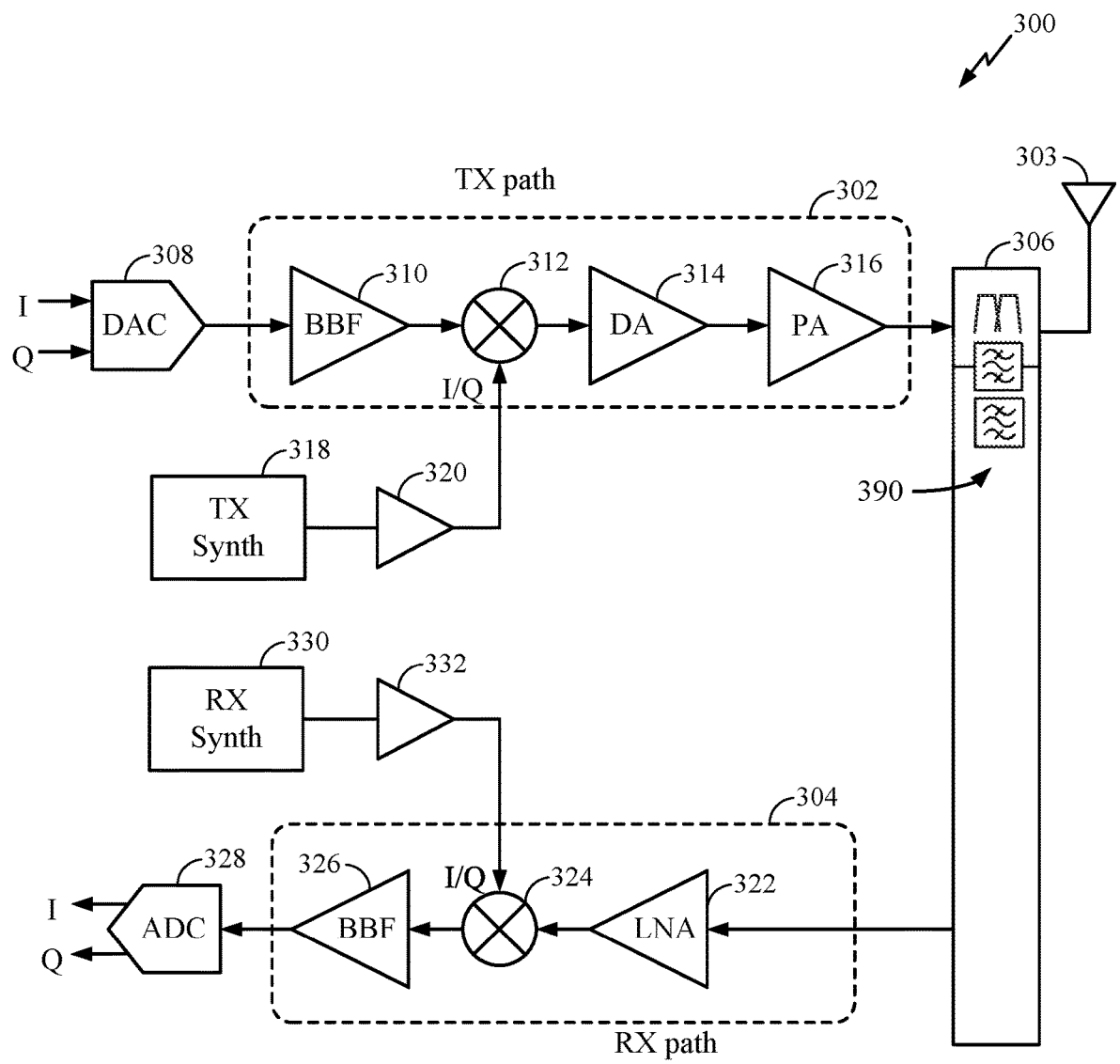
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306. In certain aspects, the interface 306 may include one or more filters 390 (e.g., forming a diplexer). The one or more filters may be implemented using an acoustic wave resonator and have a relatively low insertion loss as compared to other filter implementations, as described in more detail here. In some aspects, the interface 306 may include one or more modules including the one or more filters 390.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Tuning the LO to different frequencies typically entails using a variable-frequency oscillator. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While a specific configuration of components is described with respect to FIG. 3 to facilitate understanding, the aspects described herein may be implemented with any suitable component or integrated circuit (IC) configuration. For example, a wireless node may be implemented with a modem coupled to a transceiver chip (e.g., including the TX path 302 and the RX path 304) and one or more modules that may include the filter circuits described herein. In some aspects, the filter circuits may be implemented using standalone components and coupled to the transceiver chip. In other aspects, an integrated solution may be used where the transceiver components and the filter circuits are part of the same IC.

Example Resonator Filter Circuit

Certain aspects of the present disclosure provide techniques for implementing a filter operating in higher frequencies (e.g., such as above 4-5 GHz—with one example being around 8 GHz)) with performance enhancements by leveraging acoustic wave technology (e.g., using one or more bulk acoustic wave (BAW) resonators) in combination with other filter components. It can be difficult to achieve low insertion loss (IL) for a high frequency filter (e.g., a bandpass filter with a center frequency of about 8 GHz) when using a BAW resonator. Moreover, inductors in inductor-capacitor (LC) filters tend to have poor quality factor (Q) at high frequencies. Large inductance values of coils (e.g., inductors) with low Q lead to high losses across the coils. It may be desirable to incorporate elements with high Q to achieve steep roll-offs when implementing broadband filters with steep skirts (e.g., transition bands). Certain aspects of the present disclosure are directed to a filter incorporating an acoustic filter component (such as a BAW resonator) having a lower insertion loss and smaller footprint as compared to conventional implementations.

Figure 4:
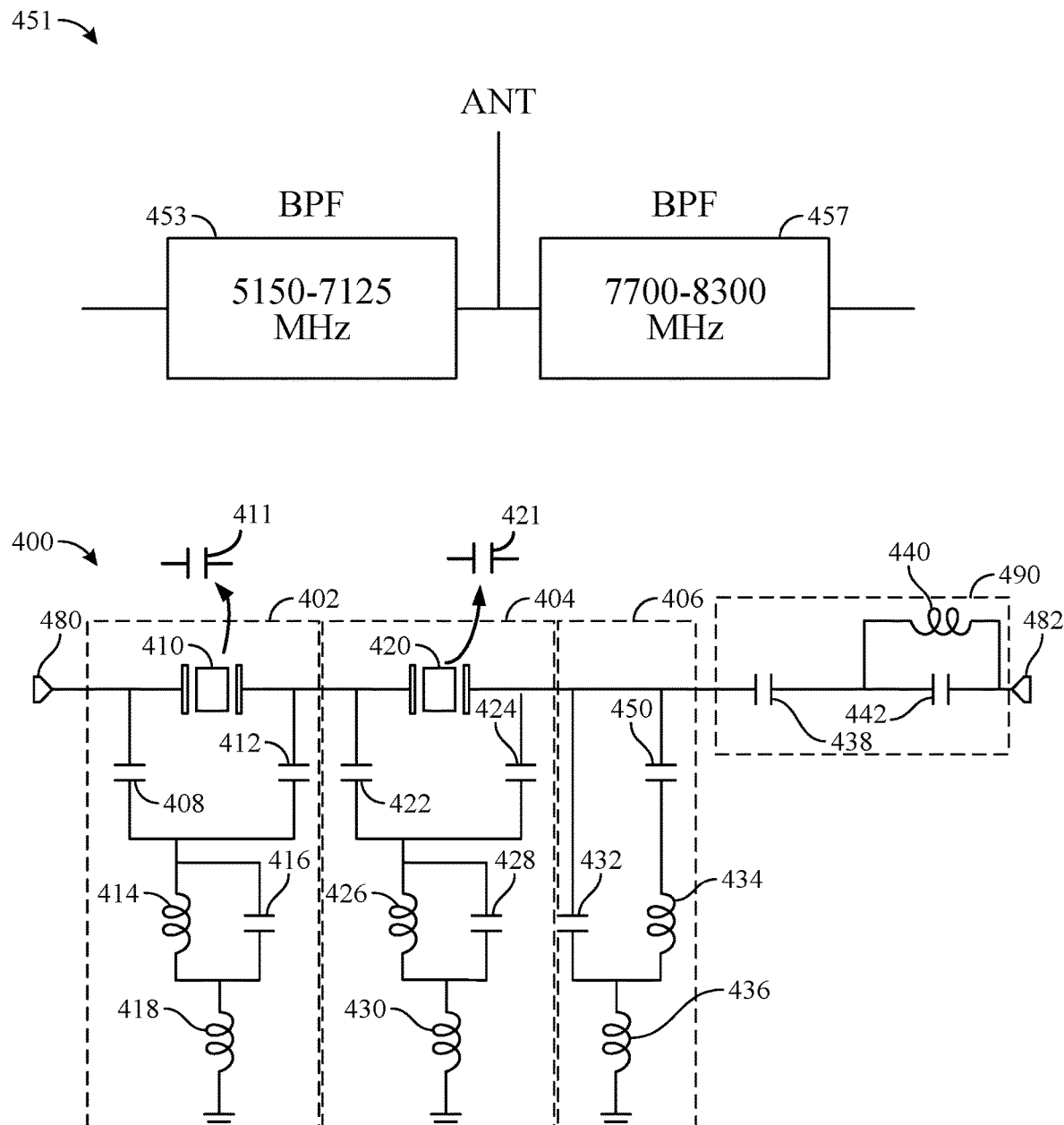
FIG. 4 illustrates an example filter circuit implemented using bulk acoustic wave (BAW) resonators, in accordance with certain aspects of the present disclosure.

FIG. 4 illustrates an example filter circuit 400 implemented using acoustic wave resonators (e.g., multiple BAW resonators), in accordance with certain aspects of the present disclosure. As shown, the filter circuit 400 includes a filter stage 402 having an acoustic wave resonator 410 in a series path between a port 480 and a port 482 of the filter circuit 400. A capacitor 408 is coupled between a first terminal of the acoustic wave resonator 410 and an LC tank circuit implemented using an inductor 414 in parallel with a capacitor 416. Moreover, a capacitor 412 may be coupled between a second terminal of the acoustic wave resonator 410 and the LC tank circuit. In some cases, an optional inductive element 418 (at least a portion of which may represent parasitic inductance) may be coupled between the LC tank circuit and a reference potential node (e.g., electrical ground), as shown. While the parasitic inductive elements (e.g., inductive elements 418, 430, 436) are not shown in FIGS. 5A, 6, 7A, 8, 9, and 10A, the filter circuits shown in FIGS. 5A, 6, 7A, 8, 9, and 10A may also include the parasitic inductive elements in some implementations.

The filter circuit 400 may include another filter stage 404, which may be implemented with a similar topology as filter stage 402. As shown, the filter stage 404 has an acoustic wave resonator 420 in the series path between the port 480 and the port 482. A capacitor 422 is coupled between a first terminal of the acoustic wave resonator 420 and an LC tank circuit implemented using an inductor 426 in parallel with a capacitor 428. Moreover, a capacitor 424 may be coupled between a second terminal of the acoustic wave resonator 420 and the LC tank circuit. In some cases, an inductive element 430 (at least a portion of which may represent parasitic inductance) may be coupled between the LC tank circuit and the reference potential node, as shown.

In some aspects, the filter circuit 400 may include another filter stage 490 coupled in the series path between the port 480 and the port 482. The filter stage 490 may include a capacitor 438 coupled to a parallel LC circuit including a capacitor 442 in parallel with an inductor 440.

In some cases, the filter circuit 400 may include one or more optional filter stages such as the optional filter stage 406 coupled in shunt to the series path, as shown. For example, the filter stage 406 may include a capacitor 450 coupled to an inductor 434, forming a series LC circuit. The series LC circuit (e.g., including capacitor 450 and the inductor 434) is coupled in parallel with a capacitor 432, as shown. In some cases, an inductive element 436 (at least a portion of which may represent parasitic inductance) may be coupled between the capacitor 432 and the reference potential node, as shown. Other topologies with a different arrangement of inductive or capacitive elements (or other filter components, either acoustic or non-acoustic) for the one or more filter stages in addition to stages 402 and 404 may be provided.

As shown in FIG. 4, the filter circuit 400 may be implemented as part of a diplexer 451. In other implementations, the filter circuit 400 could be in a duplexer, could be implemented as a standalone component, or could be integrated into a module with other filters or other components. The diplexer 451 may include a bandpass filter (BPF) 453 and a BPF 457 coupled to an antenna (ANT) terminal, as shown. For purposes of illustration only, as one example, the BPF 453 may include a passband of 5.15 to 7.125 GHz, and the BPF 457 may include a passband of 7.7 to 8.3 GHz. The filter circuit 400 having the acoustic wave resonators as described herein may be used to implement the BPF 457, as one example. The BPF 457 may be designed to provide other passbands in other frequency ranges based on a similar topology but with different component values or other filter stages.

In some aspects, the topology of the filter circuit 400 can be realized via various equivalent transformations of certain other filter stage topologies. Each equivalent transformation may implement a performance improvement, such as lowering inductance and/or capacitance values, and lowering of insertion loss. The filter circuit 400 thereby includes various features based on the transformations that improve the overall filter performance for particular applications.

In some aspects of the present disclosure, the filter circuit 400 may be implemented using capacitors instead of acoustic wave resonators. For example, the acoustic wave resonator 410 may be replaced with a capacitor 411, and the acoustic wave resonator 420 may be replaced with the capacitor 421, as shown.

Figure 5A:
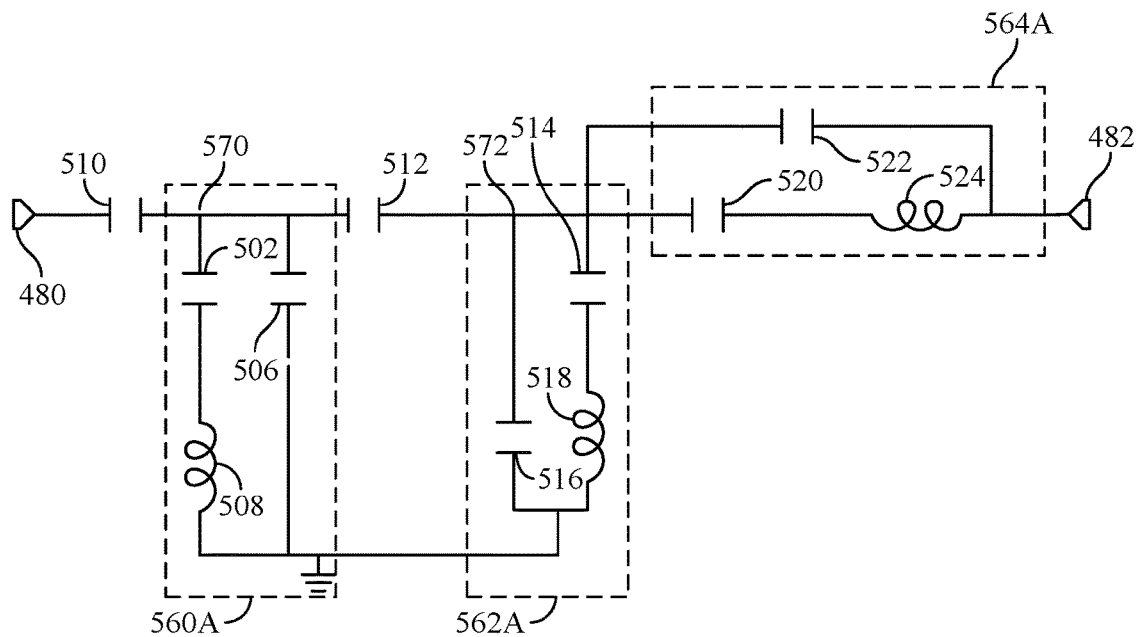
FIGS. 5A and 5B illustrate an equivalent transformation facilitating a reduction of inductance values, in accordance with certain aspects of the present disclosure.
Figure 5B:
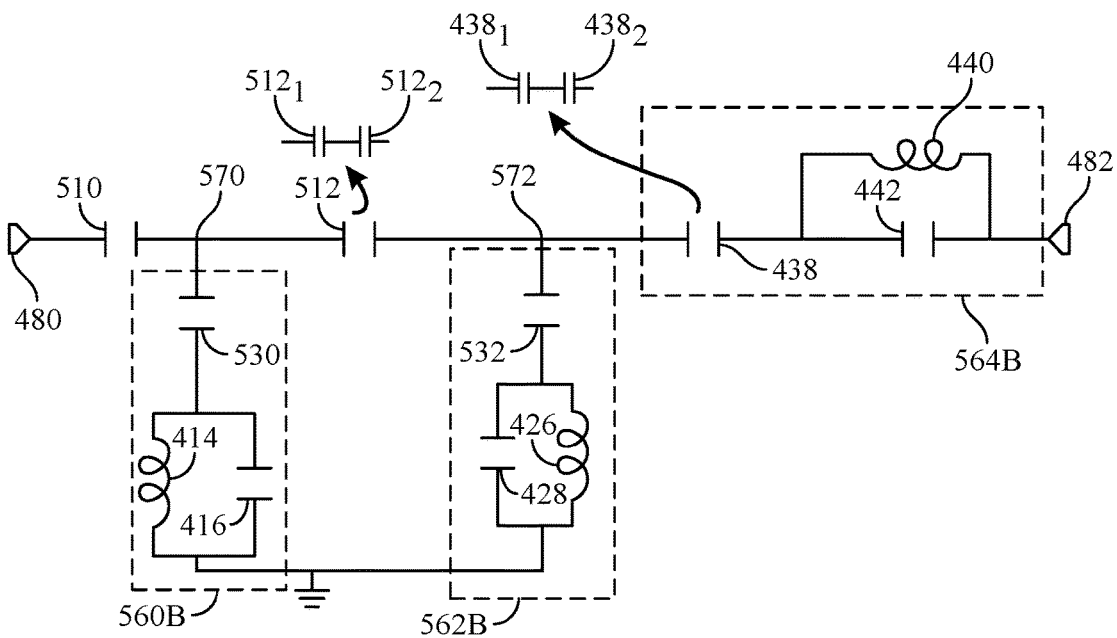

FIGS. 5A and 5B illustrate an equivalent transformation facilitating a reduction of inductance values, in accordance with certain aspects of the present disclosure. The filter circuit 501 of FIG. 5B is designed using an equivalent transformation of filter circuit 500 of FIG. 5A. As shown, the filter circuit 500 includes a filter stage 560A having a series LC circuit including a capacitor 502 and an inductor 508, the series LC circuit being in parallel with a capacitor 506. The filter circuit 500 also includes a filter stage 562A having a series LC circuit including a capacitor 514 and an inductor 518, the series LC circuit being in parallel with a capacitor

516, as shown. The filter circuit 500 also includes a filter stage 564A in a series path between the port 480 and port 482. The filter stage 564A includes a series LC circuit including capacitor 520 and inductor 524, the series LC circuit being in parallel with capacitor 522, as shown. In some aspects, capacitors 510, 512 may be coupled in the series path between port 480 and port 482, filter stage 560A being coupled to a node 570 between the capacitors 510, 512, as shown. The filter stage 562A may be coupled to node 572 between the capacitor 512 and the filter stage 564A.

In certain aspects, the filter stage 560B of FIG. 5B may be designed using an equivalent transformation of filter stage 560A of FIG. 5A. As shown, the filter stage 560B includes a parallel LC circuit having inductor 414 in parallel with capacitor 416. A capacitor 530 may be coupled between the node 570 and the parallel LC circuit in filter stage 560B. Similarly, the filter stage 562B may be designed using an equivalent transformation of filter stage 562A. As shown, the filter stage 562B includes a parallel LC circuit having inductor 426 in parallel with capacitor 428. A capacitor 532 may be coupled between the node 572 and the parallel LC circuit in filter stage 562B.

In certain aspects, the filter stage 564B of FIG. 5B may be designed using an equivalent transformation of filter stage 564A of FIG. 5A. As shown, the filter stage 564B includes a parallel LC circuit having inductor 440 in parallel with capacitor 442. A capacitor 438 may be coupled between the node 572 and the parallel LC circuit, as shown.

Using the equivalent transformations allows for a reduction in inductance values. For example, the inductance of inductor 508 in filter stage 560A may be about 1 nH, whereas the inductance of inductor 414 of filter stage 560B may be about 0.3 nH. Similarly, the inductance of inductor 518 in filter stage 562A may be about 1 nH, whereas the inductance of inductor 426 of filter stage 562B may be about 0.3 nH. The inductance of inductor 524 in filter stage 564A may be about 5.6 nH, whereas the inductance of inductor 440 of filter stage 564B may be about 1.3 nH. Smaller inductance values allow for implementing filters with lower insertion loss. Moreover, inductors with smaller inductances can be implemented with wider lines (e.g., larger cross-sections), allowing for a reduction of power loss.

Figure 6:
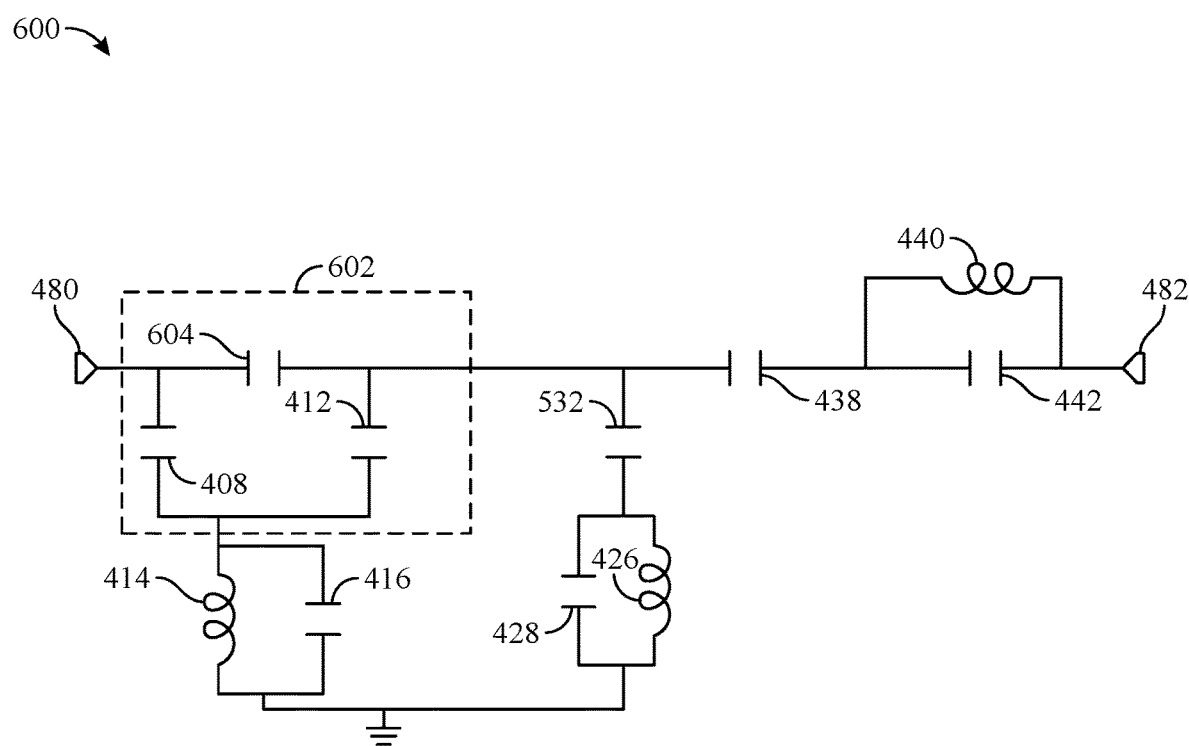
FIG. 6 illustrates a filter circuit designed using an equivalent transformation facilitating a reduction of capacitance values, in accordance with certain aspects of the present disclosure.

FIG. 6 illustrates a filter circuit 600 designed using an equivalent transformation facilitating a reduction of capacitance values, in accordance with certain aspects of the present disclosure. The filter circuit 600 of FIG. 6 is designed using a star-to-delta equivalent transformation on filter circuit 501 of FIG. 5B.

As shown in FIG. 5B, the capacitors 510, 512, 530 have a star formation (also known as a "Y formation"), as each of capacitors has a terminal coupled to node 570. Using the star-to-delta equivalent transformation, the topology of capacitors 510, 512, 530 may be converted to topology 602 as shown in FIG. 6. The topology 602 includes capacitors 604, 408, 412 in a delta formation, as shown. The star-to-delta equivalent transformation allows for a reduction of capacitance values. For example, the capacitors 510, 512, 530 may have respective capacitances of about 1.2 pF, 0.4 pF, and 1.4 pF in filter circuit 501 of FIG. 5B, whereas capacitors 604, 408, 412 may have respective capacitances of about 0.15 pF, 0.55 pF, and 0.18 pF in filter circuit 600 of FIG. 6. The topology 602 includes a T-bridge formation (also referred to as a bridged-T network) with relatively small capacitance values, allowing for implementation of an acoustic wave (e.g., bulk acoustic wave (BAW)) resonator, as described in more detail with respect to FIGS. 7A and 7B.

Figure 7A:
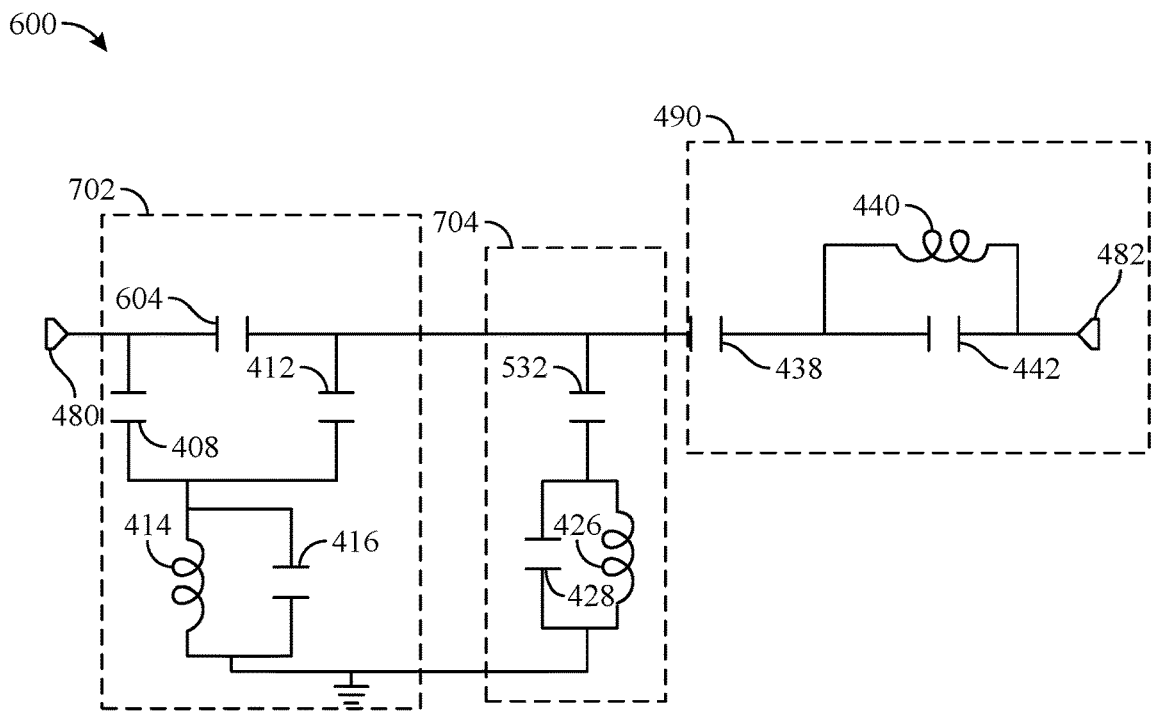
FIGS. 7A and 7B illustrate a filter circuit and a corresponding graph showing a frequency response associated with the filter circuit, in accordance with certain aspects of the present disclosure.
Figure 7B:
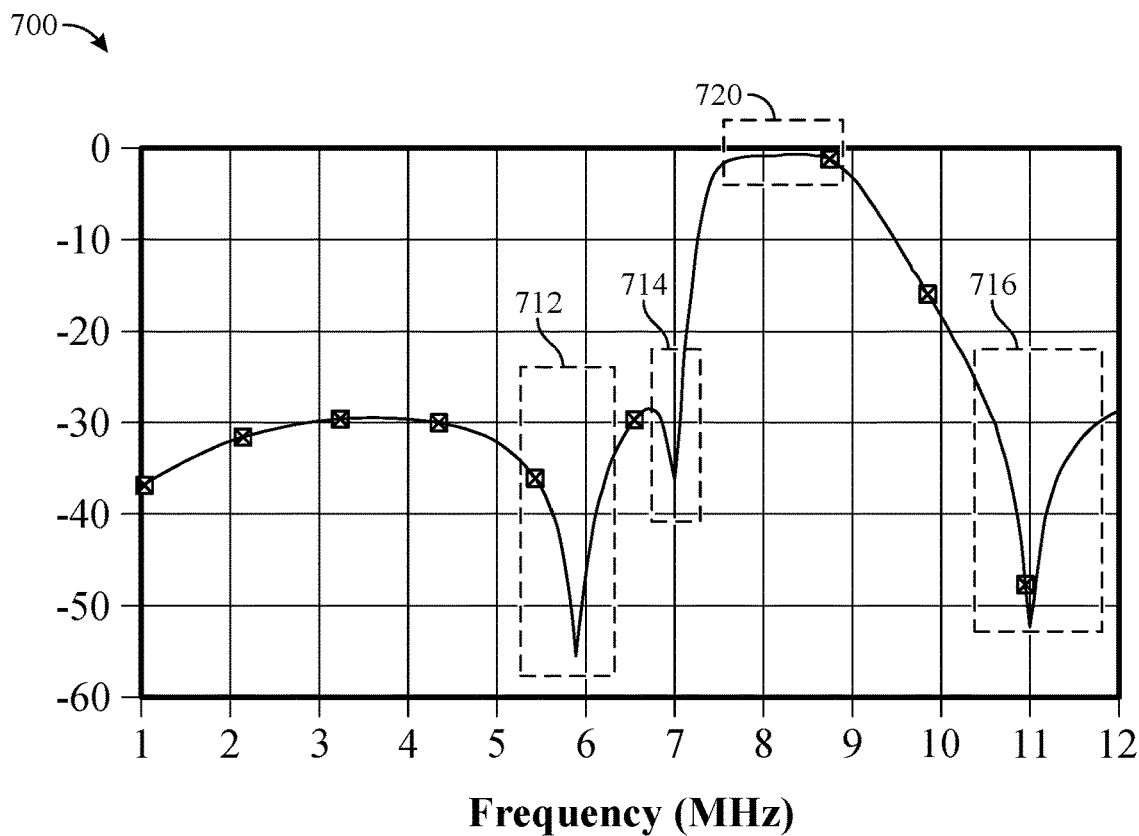

FIGS. 7A and 7B illustrate the filter circuit 600 and a corresponding graph 700 showing a frequency response associated with the filter circuit 600, in accordance with certain aspects of the present disclosure. The frequency response includes a notch 712 implemented by the filter stage 702, a notch 714 implemented by the filter stage 704, and a notch 716 implemented by the filter stage 490. As shown, the notches 712, 714 are at frequencies less than a passband 720 of the filter circuit 600, and the notch 716 is at a frequency that is greater than the passband 720.

Figure 8:
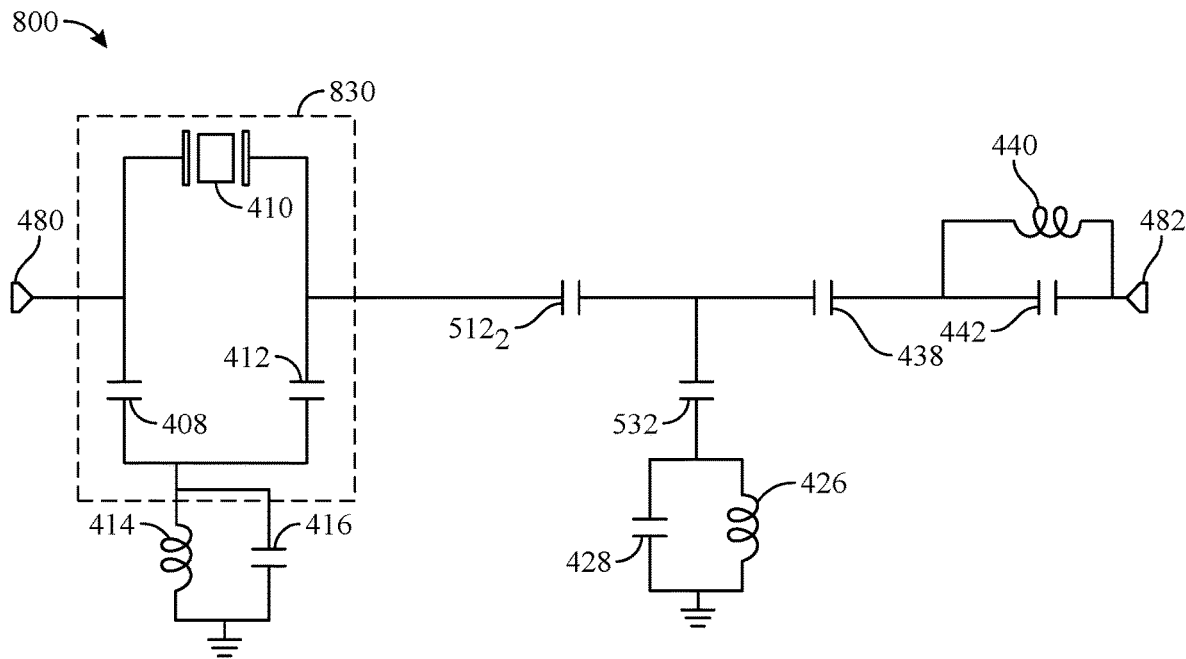
FIG. 8 illustrates a filter circuit having an acoustic wave resonator, in accordance with certain aspects of the present disclosure.

FIG. 8 illustrates a filter circuit 800 having an acoustic wave resonator 410, in accordance with certain aspects of the present disclosure. The capacitor 604 of filter circuit 600 shown in FIG. 6 has been replaced with the acoustic wave resonator 410 in the delta formation 830. The implementation of the acoustic wave resonator 410 (e.g., a BAW resonator) allows for operations at higher frequencies (e.g., 7.7 GHz to 8.3 GHz).

Referring back to FIG. 5B, the capacitor 512 may be implemented using two separate series-coupled capacitors $512_1$ and $512_2$. Capacitor $512_1$ facilitates the star-to-delta transformation to obtain the delta topology 602 as described with respect to FIG. 6. Moreover, the capacitor 438 may be implemented using two separate series-coupled capacitors $438_1$ and $438_2$. The capacitors $512_2$, 532, $438_1$ facilitate a star-to-delta transformation as shown in FIG. 9.

As shown, filter circuit 800 includes a filter stage having an acoustic wave resonator 410 coupled in a series path between a port 480 of the filter circuit and a port 482 of the filter circuit. A capacitor 408 is coupled between a first terminal of the acoustic wave resonator 410 and an LC tank circuit (e.g., including inductor 414 and capacitor 416), the LC tank circuit being coupled between the capacitor 408 and an electrical ground node (e.g., a reference potential node). A capacitor 412 is coupled between a second terminal of the acoustic wave resonator 410 and the LC tank circuit. One or more other filter stages may be coupled to the filter stage, as described herein.

Figure 9:
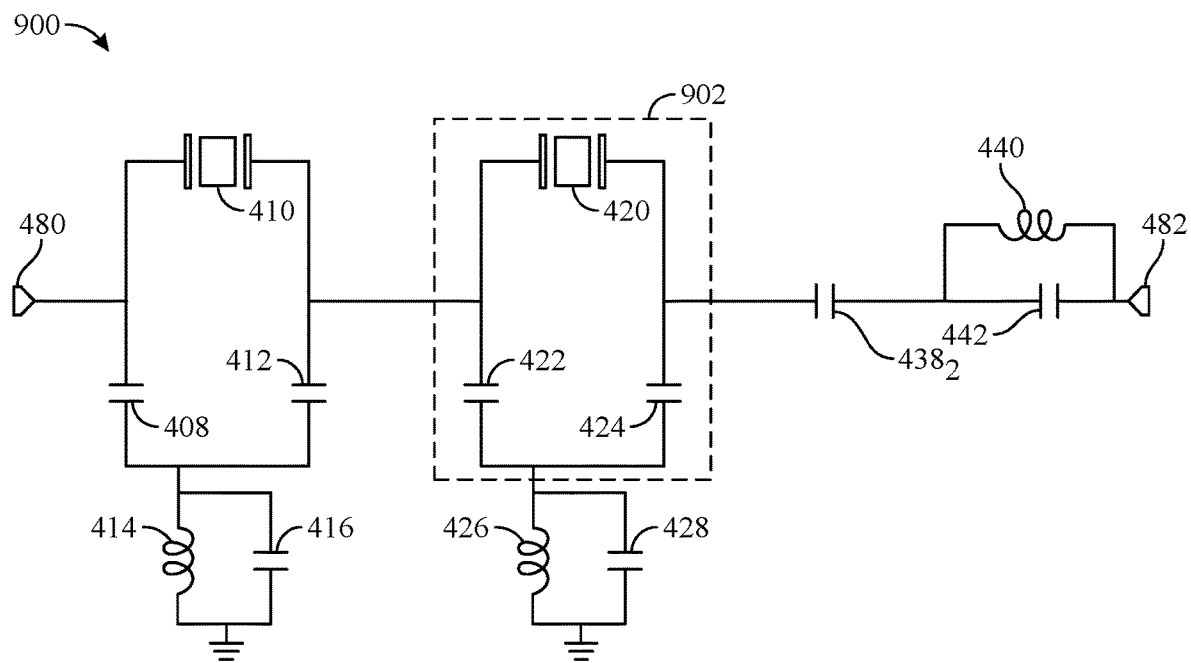
FIG. 9 illustrates a filter circuit including a delta formation having an acoustic wave resonator, in accordance with certain aspects of the present disclosure.

FIG. 9 illustrates a filter circuit 900 including a delta formation 902 having an acoustic wave resonator 420, in accordance with certain aspects of the present disclosure. As shown, the delta formation 902 includes capacitors 422, 424, each coupled between the acoustic wave resonator 420 and the LC tank circuit having inductor 426 and capacitor 428.

In some aspects, the acoustic wave resonator 420 is coupled in a series path between port 480 of the filter circuit and port 482 of the filter circuit. A capacitor 422 is coupled between a first terminal of the acoustic wave resonator 420 and an LC tank circuit (e.g., including capacitor 428 and inductor 426), the LC tank circuit being coupled between the capacitor 422 and the electrical ground node (e.g., a reference potential node). A capacitor 424 is coupled between a second terminal of the second acoustic wave resonator and the LC tank circuit, as shown.

Figure 10A:
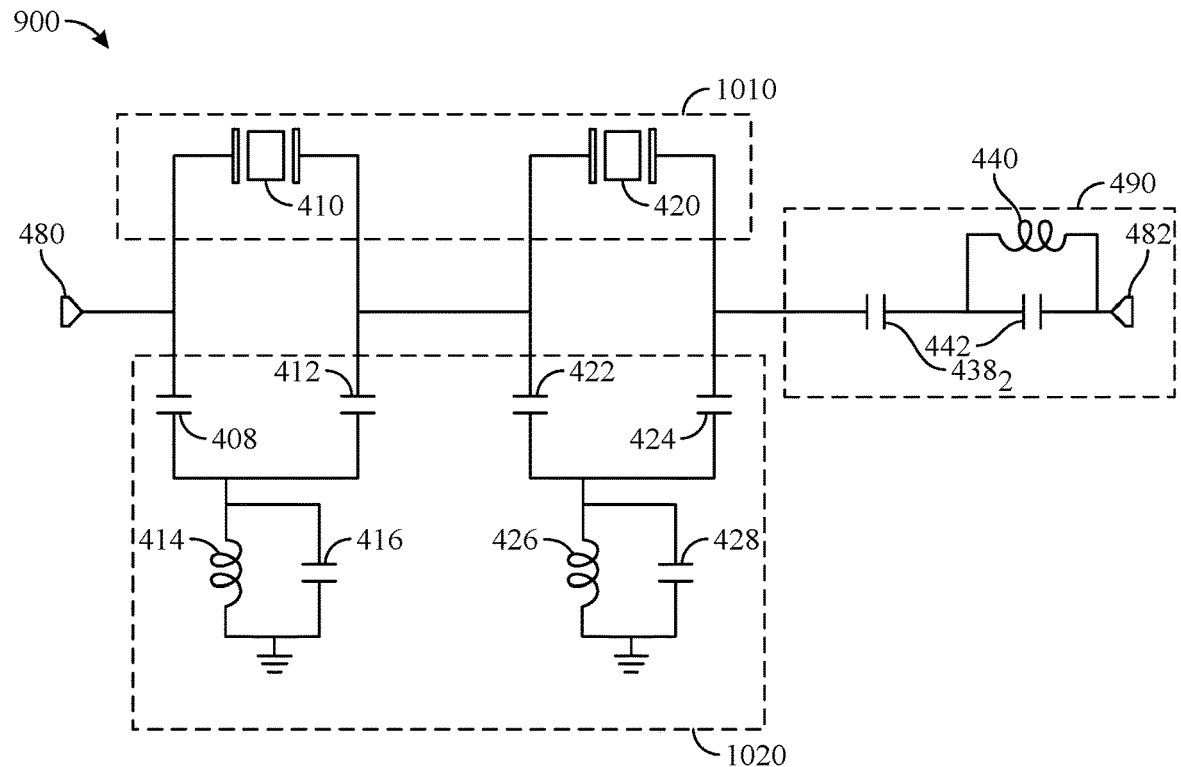
FIGS. 10A and 10B illustrate the filter circuit of FIG. 9 and a corresponding graph showing a frequency response associated with the filter circuit, in accordance with certain aspects of the present disclosure.
Figure 10B:
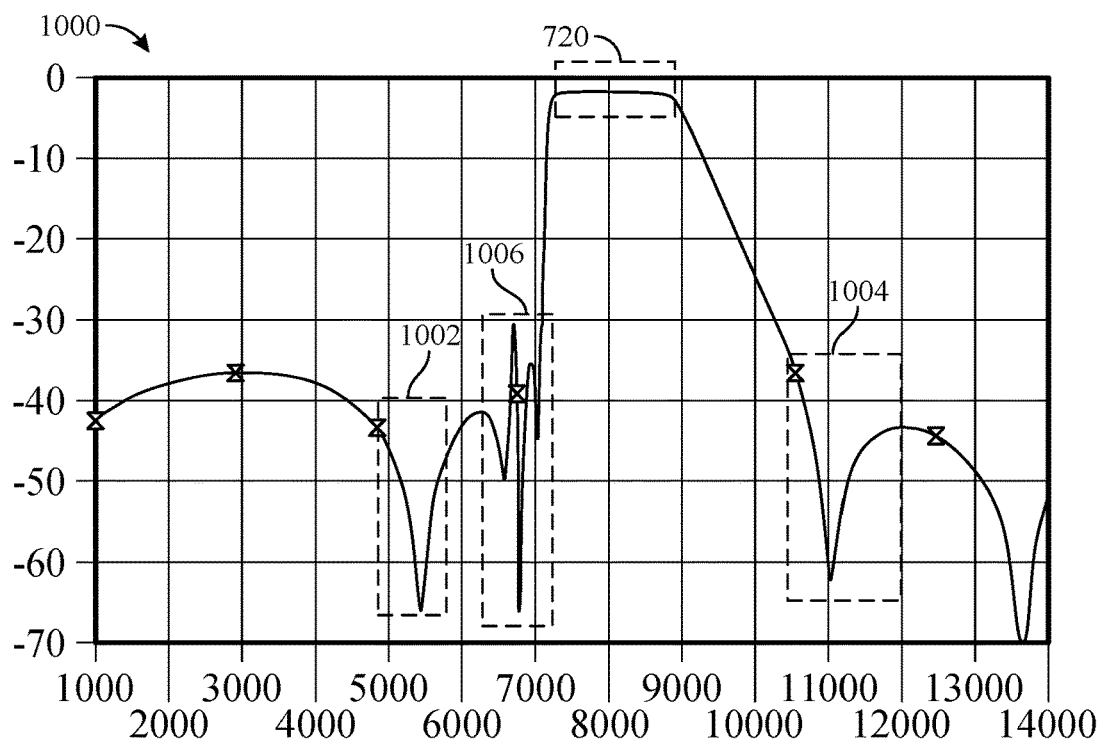

FIGS. 10A and 10B illustrate the filter circuit 900 and a corresponding graph 1000 showing a frequency response associated with the filter circuit 900, in accordance with certain aspects of the present disclosure. As shown, the frequency response includes a notch 1002 implemented by filter stages 1020, notches 1006 implemented by acoustic wave resonators 1010, and a notch 1004 implemented by filter stage 490. As compared to the frequency response shown in graph 700 of FIG. 7B, two notches 1006 are added due to the inclusion of the acoustic wave resonators 1010.

In addition to the elements of FIG. 9, the filter circuit 400 of FIG. 4 is realized in part by adding an additional filter stage 406. The filter stage 406 includes a series LC circuit having an inductor 434 and a capacitor 450, the series LC circuit being in parallel with a capacitor 432, as described herein. However, other topologies for the filter stage 406 (e.g., different arrangements and connections between LC elements) are possible.

The aspects described herein allow for implementing BAW resonator-based filters at high frequencies. Some aspects also allow for reduction of inductance values which facilitate implementation of filters with lower insertion loss. Certain aspects also allow for reduction of capacitance values that facilitate usage of acoustic wave resonators to implement frequency notches at high frequencies. Lowering of capacitances and inductances results in a smaller size and reduced cost for the filter circuits described herein as compared to conventional filter circuit implementations.

Figure 11:
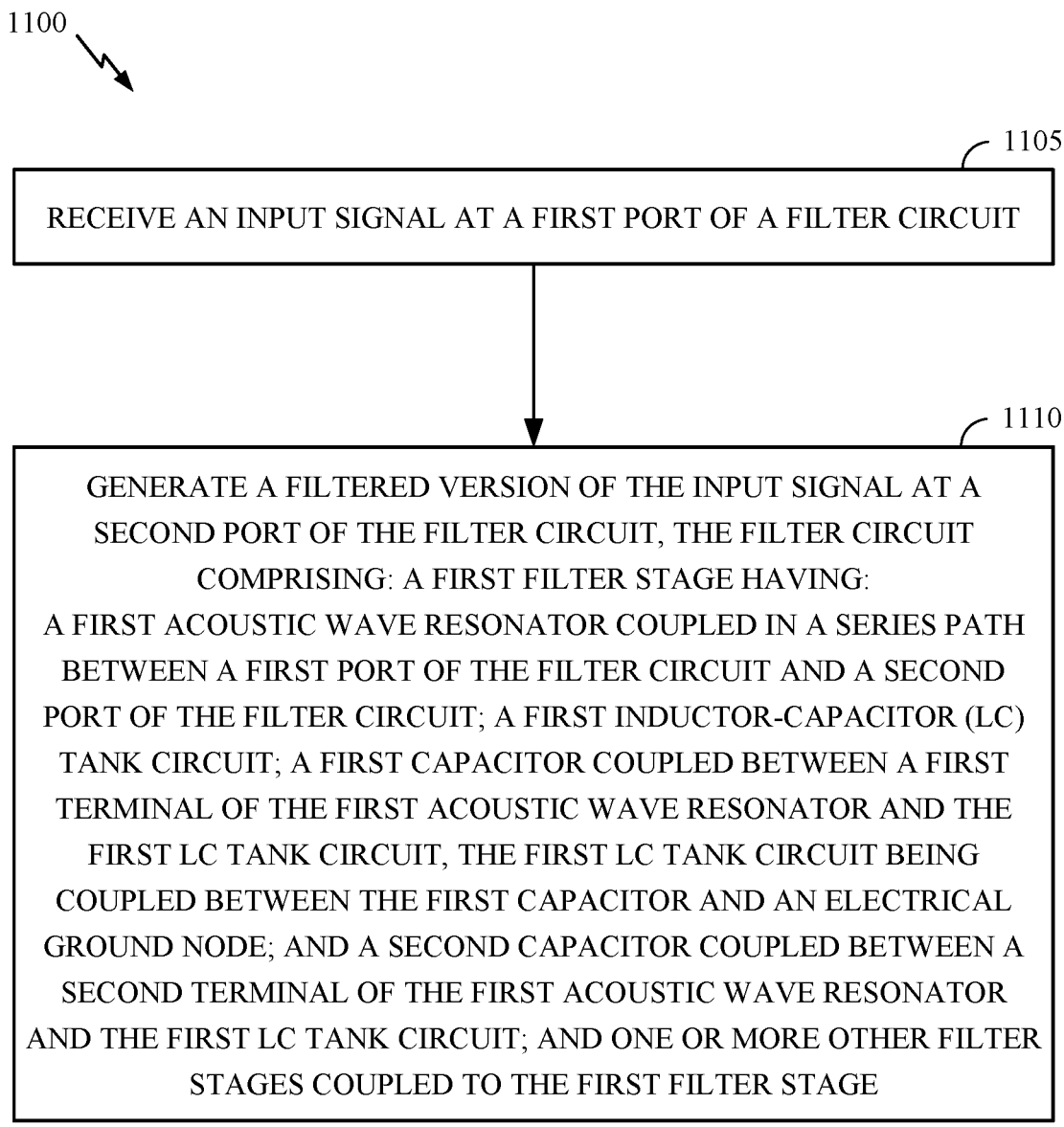
FIG. 11 is a flow diagram depicting example operations for filtering an input signal, in accordance with certain aspects of the present disclosure.

FIG. 11 is a flow diagram depicting example operations 1100 for filtering an input signal, in accordance with certain aspects of the present disclosure. For example, the operations 1100 may be performed by a filter circuit, such as the filter circuit 400 of FIG. 4, or the filter circuit 900 of FIGS. 9 and 10A.

The operations 1100 begin, at block 1105, with the filter circuit receiving the input signal at a first port of a filter circuit. At block 1110, the filter circuit generates a filtered version of the input signal at a second port of the filter circuit.

In some aspects, the filter circuit includes a first filter stage (e.g., filter stage 402) having a first acoustic wave resonator (e.g., acoustic wave resonator 410) coupled in a series path between a first port (e.g., port 480) of the filter circuit and a second port (e.g., port 482) of the filter circuit, a first inductor-capacitor (LC) tank circuit (e.g., LC tank circuit including inductor 414 and capacitor 416), a first capacitor (e.g., capacitor 408) coupled between a first terminal of the first acoustic wave resonator and the first LC tank circuit, the first LC tank circuit being coupled between the first capacitor and a reference potential node (e.g., electrical ground node), and a second capacitor (e.g., capacitor 412) coupled between a second terminal of the first acoustic wave resonator and the first LC tank circuit. In some aspects, one or more other filter stages (e.g., one or more of filter stages 404, 406, 490) is coupled to the first filter stage. In certain aspects, the first LC tank circuit includes a third capacitor (e.g., capacitor 416) and an inductor (e.g., inductor 414), the third capacitor being in parallel with the inductor.

In certain aspects, the one or more other filter stages include a second filter stage (e.g., filter stage 404) having a second acoustic wave resonator (e.g., acoustic wave resonator 420) coupled in the series path between the first port of the filter circuit and the second port of the filter circuit, a second LC tank circuit (e.g., LC tank circuit including inductor 426 and capacitor 428), a third capacitor (e.g., capacitor 422) coupled between a first terminal of the second acoustic wave resonator and the second LC tank circuit, the second LC tank circuit being coupled between the third capacitor and the reference potential node, and a fourth capacitor (e.g., capacitor 424) coupled between a second terminal of the second acoustic wave resonator and the second LC tank circuit. In some aspects, the first acoustic wave resonator and the second acoustic wave resonator are configured to implement two notches (e.g., notches 1006) in a frequency response of the filter circuit, the two notches being at frequencies lower than a passband of the frequency response.

In some aspects, the one or more other filter stages include a second filter stage (e.g., filter stage 490). The second filter stage may include a third capacitor (e.g., capacitor 438) in the series path between the first port and the second port of the filter circuit, and a second LC tank circuit (e.g., LC tank circuit including inductor 440 and capacitor 442) coupled in the series path between the first port and the second port of the filter circuit. The second LC tank circuit may include a fourth capacitor (e.g., capacitor 442) in the series path between the first port and the second port of the filter circuit, and an inductor (e.g., inductor 440) coupled in parallel with the fourth capacitor. In some aspects, the second LC tank circuit and the third capacitor are configured to implement a notch (e.g., notch 1004) in a frequency response of the filter circuit, the notch being at a frequency greater than a passband of the frequency response.

In some aspects, the one or more other filter stages include a second filter stage (e.g., filter stage 406) having a series LC circuit (e.g., LC circuit having capacitor 450 and inductor 434), and a third capacitor (e.g., capacitor 432) coupled in parallel with the series LC circuit. In some aspects, the series LC circuit includes a fourth capacitor (e.g., capacitor 450) coupled in series with an inductor (e.g., inductor 434).

In some aspects, the first capacitor, the second capacitor, and the first LC tank circuit are configured to implement a first notch (e.g., notch 1002) in a frequency response of the filter circuit, the first notch being at a frequency lower than a passband (e.g., passband 720) of the frequency response. The first acoustic wave resonator may be configured to implement a second notch (e.g., notch 1006) in the frequency response of the filter circuit, the second notch being at a frequency lower than the passband of the frequency response and greater than the frequency of the first notch. In some aspects, the filter circuit as described herein may be suited for or designed in particular for an ultra-wideband (UWB) technology using UWB frequency ranges such as around 8 GHz.

Example Aspects

Aspect 1: A filter circuit comprising: a first filter stage comprising: a first acoustic wave resonator coupled in a series path between a first port of the filter circuit and a second port of the filter circuit; a first inductor-capacitor (LC) tank circuit; a first capacitor coupled between a first terminal of the first acoustic wave resonator and the first LC tank circuit, the first LC tank circuit being coupled between the first capacitor and a reference potential node; and a second capacitor coupled between a second terminal of the first acoustic wave resonator and the first LC tank circuit; and one or more other filter stages coupled to the first filter stage.

Aspect 2: The filter circuit of Aspect 1, wherein the first LC tank circuit comprises a third capacitor and an inductor, the third capacitor being in parallel with the inductor.

Aspect 3: The filter circuit of Aspect 1 or 2, wherein the one or more other filter stages comprise a second filter stage having: a second acoustic wave resonator coupled in the series path between the first port of the filter circuit and the second port of the filter circuit; a second LC tank circuit; a third capacitor coupled between a first terminal of the second acoustic wave resonator and the second LC tank circuit, the second LC tank circuit being coupled between the third capacitor and the reference potential node; and a fourth capacitor coupled between a second terminal of the second acoustic wave resonator and the second LC tank circuit.

Aspect 4: The filter circuit of Aspect 3, wherein the first acoustic wave resonator and the second acoustic wave resonator are configured to implement two notches in a frequency response of the filter circuit, the two notches being at frequencies lower than a passband of the frequency response.

Aspect 5: The filter circuit of any of the preceding Aspects, wherein the one or more other filter stages comprise a second filter stage having: a third capacitor in the series path between the first port and the second port of the filter circuit; and a second LC tank circuit coupled in the series path between the first port and the second port of the filter circuit.

Aspect 6: The filter circuit of Aspect 5, wherein the second LC tank circuit comprises: a fourth capacitor in the series path between the first port and the second port of the filter circuit; and an inductor coupled in parallel with the fourth capacitor.

Aspect 7: The filter circuit of Aspect 5 or 6, wherein the second LC tank circuit and the third capacitor are configured to implement a notch in a frequency response of the filter circuit, the notch being at a frequency greater than a passband of the frequency response.

Aspect 8: The filter circuit of any of the preceding Aspects, wherein the one or more other filter stages comprise a second filter stage having: a series LC circuit; and a third capacitor coupled in parallel with the series LC circuit.

Aspect 9: The filter circuit of Aspect 8, wherein the series LC circuit comprises a fourth capacitor coupled in series with an inductor.

Aspect 10: The filter circuit of any of the preceding Aspects, wherein the first acoustic wave resonator comprises a bulk acoustic wave (BAW) resonator.

Aspect 11: The filter circuit of any of the preceding Aspects, wherein: the first capacitor, the second capacitor, and the first LC tank circuit are configured to implement a first notch in a frequency response of the filter circuit, the first notch being at a frequency lower than a passband of the frequency response; and the first acoustic wave resonator is configured to implement a second notch in the frequency response of the filter circuit, the second notch being at a frequency lower than the passband of the frequency response and greater than the frequency of the first notch.

Aspect 12: The filter circuit of any of the preceding Aspects, further comprising an inductive element coupled between the first LC tank circuit and the reference potential node.

Aspect 13: An apparatus comprising a diplexer having the filter circuit of any of the preceding Aspects.

Aspect 14: The apparatus of Aspect 13, further comprising an antenna, wherein the diplexer is coupled to the antenna.

Aspect 15: A method for filtering an input signal, comprising: receiving the input signal at a first port of a filter circuit; and generating a filtered version of the input signal at a second port of the filter circuit, the filter circuit comprising: a first filter stage having: a first acoustic wave resonator coupled in a series path between the first port of the filter circuit and the second port of the filter circuit; a first inductor-capacitor (LC) tank circuit; a first capacitor coupled between a first terminal of the first acoustic wave resonator and the first LC tank circuit, the first LC tank circuit being coupled between the first capacitor and a reference potential node; and a second capacitor coupled between a second terminal of the first acoustic wave resonator and the first LC tank circuit; and one or more other filter stages coupled to the first filter stage.

Aspect 16: The method of Aspect 15, wherein the first LC tank circuit comprises a third capacitor and an inductor, the third capacitor being in parallel with the inductor.

Aspect 17: The method of Aspect 15 or 16, wherein the one or more other filter stages comprise a second filter stage having: a second acoustic wave resonator coupled in the series path between the first port of the filter circuit and the second port of the filter circuit; a second LC tank circuit; a third capacitor coupled between a first terminal of the second acoustic wave resonator and the second LC tank circuit, the second LC tank circuit being coupled between the third capacitor and the reference potential node; and a fourth capacitor coupled between a second terminal of the second acoustic wave resonator and the second LC tank circuit.

Aspect 18: The method of Aspect 17, wherein the first acoustic wave resonator and the second acoustic wave resonator are configured to implement two notches in a frequency response of the filter circuit, the two notches being at frequencies lower than a passband of the frequency response.

Aspect 19: The method of any of Aspects 15-18, wherein the one or more other filter stages comprise a second filter stage having: a third capacitor in the series path between the first port and the second port of the filter circuit; and a second LC tank circuit coupled in the series path between the first port and the second port of the filter circuit.

Aspect 20: The method of Aspect 19, wherein the second LC tank circuit and the third capacitor are configured to implement a notch in a frequency response of the filter circuit, the notch being at a frequency greater than a passband of the frequency response.

Aspect 21: The method of any of Aspects 15-20, wherein the one or more other filter stages comprise a second filter stage having a series LC circuit and a third capacitor coupled in parallel with the series LC circuit.

Aspect 22: The method of any of Aspects 15-21, wherein: the first capacitor, the second capacitor, and the first LC tank circuit are configured to implement a first notch in a frequency response of the filter circuit, the first notch being at a frequency lower than a passband of the frequency response; and the first acoustic wave resonator is configured to implement a second notch in the frequency response of the filter circuit, the second notch being at a frequency lower than the passband of the frequency response and greater than the frequency of the first notch.

Aspect 23: A filter circuit comprising: a first filter stage comprising: a first capacitor coupled in a series path between a first port of the filter circuit and a second port of the filter circuit; a first inductor-capacitor (LC) tank circuit; a second capacitor coupled between a first terminal of the first capacitor and the first LC tank circuit, the first LC tank circuit being coupled between the first capacitor and a reference potential node; and a third capacitor coupled between a second terminal of the first capacitor and the first LC tank circuit; and one or more other filter stages coupled to the first filter stage.

Aspect 24: The filter circuit of Aspect 23, wherein the first LC tank circuit comprises a fourth capacitor and an inductor, the fourth capacitor being in parallel with the inductor.

Aspect 25: The filter circuit of Aspect 23 or 24, wherein the one or more other filter stages comprise a second filter stage having: a fourth capacitor coupled in the series path between the first port of the filter circuit and the second port of the filter circuit; a second LC tank circuit; a fifth capacitor coupled between a first terminal of the fourth capacitor and the second LC tank circuit, the second LC tank circuit being coupled between the fifth capacitor and the reference potential node; and a sixth capacitor coupled between a second terminal of the fourth capacitor and the second LC tank circuit.

Aspect 26: The filter circuit of any of Aspects 23-25, wherein the one or more other filter stages comprise a second filter stage having: a fourth capacitor in the series path between the first port and the second port of the filter circuit; and a second LC tank circuit coupled in the series path between the first port and the second port of the filter circuit.

Aspect 27: The filter circuit of Aspect 26, wherein the second LC tank circuit comprises: a fifth capacitor in the series path between the first port and the second port of the filter circuit; and an inductor coupled in parallel with the fifth capacitor.

Aspect 28: The filter circuit of any of Aspects 23-27, wherein the one or more other filter stages comprise a second filter stage having a series LC circuit and a fourth capacitor coupled in parallel with the series LC circuit.

Aspect 29: The filter circuit of Aspect 28, wherein the series LC circuit comprises a fifth capacitor coupled in series with an inductor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A filter circuit comprising:
   a first filter stage comprising:
      a first acoustic wave resonator coupled in a series path between a first port of the filter circuit and a second port of the filter circuit;
      a first inductor-capacitor (LC) tank circuit;
      a first capacitor coupled between a first terminal of the first acoustic wave resonator and the first LC tank circuit, the first LC tank circuit being coupled between the first capacitor and a reference potential node;
      a second capacitor coupled between a second terminal of the first acoustic wave resonator and the first LC tank circuit; and
      an inductive element coupled between the first LC tank circuit and the reference potential node; and
   one or more other filter stages coupled to the first filter stage.

2. The filter circuit of claim 1, wherein the first LC tank circuit comprises a third capacitor and an inductor, the third capacitor being coupled in parallel with the inductor.

3. The filter circuit of claim 1, wherein the one or more other filter stages comprise a second filter stage having:
   a second acoustic wave resonator coupled in the series path between the first port of the filter circuit and the second port of the filter circuit;
   a second LC tank circuit;
   a third capacitor coupled between a first terminal of the second acoustic wave resonator and the second LC tank circuit, the second LC tank circuit being coupled between the third capacitor and the reference potential node; and a fourth capacitor coupled between a second terminal of the second acoustic wave resonator and the second LC tank circuit.

4. The filter circuit of claim 3, wherein the first acoustic wave resonator and the second acoustic wave resonator are configured to implement two notches in a frequency response of the filter circuit, the two notches being at frequencies lower than a passband of the frequency response.

5. The filter circuit of claim 1, wherein the one or more other filter stages comprise a second filter stage having:
a third capacitor in the series path between the first port and the second port of the filter circuit; and
a second LC tank circuit coupled in the series path between the first port and the second port of the filter circuit.

6. The filter circuit of claim 5, wherein the second LC tank circuit comprises:
a fourth capacitor in the series path between the first port and the second port of the filter circuit; and
an inductor coupled in parallel with the fourth capacitor.

7. The filter circuit of claim 5, wherein the second LC tank circuit and the third capacitor are configured to implement a notch in a frequency response of the filter circuit, the notch being at a frequency greater than a passband of the frequency response.

8. The filter circuit of claim 1, wherein the one or more other filter stages comprise a second filter stage having:
a series LC circuit; and
a third capacitor coupled in parallel with the series LC circuit.

9. The filter circuit of claim 8, wherein the series LC circuit comprises a fourth capacitor coupled in series with an inductor.

10. The filter circuit of claim 1, wherein the first acoustic wave resonator comprises a bulk acoustic wave (BAW) resonator.

11. The filter circuit of claim 1, wherein:
the first capacitor, the second capacitor, and the first LC tank circuit are configured to implement a first notch in a frequency response of the filter circuit, the first notch being at a frequency lower than a passband of the frequency response; and
the first acoustic wave resonator is configured to implement a second notch in the frequency response of the filter circuit, the second notch being at a frequency lower than the passband of the frequency response and greater than the frequency of the first notch.

12. An apparatus comprising a diplexer having the filter circuit of claim 1.

13. The apparatus of claim 12, further comprising an antenna, wherein the diplexer is coupled to the antenna.

14. A method for filtering an input signal, comprising:
receiving the input signal at a first port of a filter circuit; and
generating a filtered version of the input signal at a second port of the filter circuit, the filter circuit comprising:
a first filter stage having:
a first acoustic wave resonator coupled in a series path between the first port of the filter circuit and the second port of the filter circuit;
a first inductor-capacitor (LC) tank circuit;
a first capacitor coupled between a first terminal of the first acoustic wave resonator and the first LC tank circuit, the first LC tank circuit being coupled between the first capacitor and a reference potential node; and
a second capacitor coupled between a second terminal of the first acoustic wave resonator and the first LC tank circuit; and
one or more other filter stages coupled to the first filter stage, wherein the one or more other filter stages comprise a second filter stage including:
a third capacitor in the series path between the first port and the second port of the filter circuit; and
a second LC tank circuit coupled in the series path between the first port and the second port of the filter circuit.

15. The method of claim 14, wherein:
the first capacitor, the second capacitor, and the first LC tank circuit are configured to implement a first notch in a frequency response of the filter circuit, the first notch being at a frequency lower than a passband of the frequency response; and
the first acoustic wave resonator is configured to implement a second notch in the frequency response of the filter circuit, the second notch being at a frequency lower than the passband of the frequency response and greater than the frequency of the first notch.

16. The method of claim 14, wherein the first LC tank circuit comprises a fourth capacitor and an inductor, the fourth capacitor being coupled in parallel with the inductor.

17. The method of claim 14, wherein the one or more other filter stages further comprise a third filter stage having:
a second acoustic wave resonator coupled in the series path between the first port of the filter circuit and the second port of the filter circuit;
a third LC tank circuit;
a fourth capacitor coupled between a first terminal of the second acoustic wave resonator and the third LC tank circuit, the third LC tank circuit being coupled between the fourth capacitor and the reference potential node; and
a fifth capacitor coupled between a second terminal of the second acoustic wave resonator and the third LC tank circuit.

18. The method of claim 17, wherein the first acoustic wave resonator and the second acoustic wave resonator are configured to implement two notches in a frequency response of the filter circuit, the two notches being at frequencies lower than a passband of the frequency response.

19. The method of claim 14, wherein the one or more other filter stages comprise a third filter stage having:
a series LC circuit; and
a fourth capacitor coupled in parallel with the series LC circuit.

20. The method of claim 14, wherein the second LC tank circuit and the third capacitor are configured to implement a notch in a frequency response of the filter circuit, the notch being at a frequency greater than a passband of the frequency response.

21. A filter circuit comprising:
a first filter stage comprising:
a first capacitor coupled in a series path between a first port of the filter circuit and a second port of the filter circuit;
a first inductor-capacitor (LC) tank circuit;
a second capacitor coupled between a first terminal of the first capacitor and the first LC tank circuit, the first LC tank circuit being coupled between the first capacitor and a reference potential node; and a third capacitor coupled between a second terminal of the first capacitor and the first LC tank circuit; and one or more other filter stages coupled to the first filter stage, wherein the one or more other filter stages comprise a second filter stage having:

a fourth capacitor in the series path between the first port and the second port of the filter circuit; and a second LC tank circuit coupled in the series path between the first port and the second port of the filter circuit.

22. The filter circuit of claim 21, wherein the one or more other filter stages further comprise a third filter stage having:
a series LC circuit; and
a fifth capacitor coupled in parallel with the series LC circuit.

23. The filter circuit of claim 22, wherein the series LC circuit comprises a sixth capacitor coupled in series with an inductor.

24. The filter circuit of claim 21, wherein the first LC tank circuit comprises a fifth capacitor and an inductor, the fifth capacitor being coupled in parallel with the inductor.

25. The filter circuit of claim 21, wherein the one or more other filter stages comprise a third filter stage having:

a fifth capacitor coupled in the series path between the first port of the filter circuit and the second port of the filter circuit;

a third LC tank circuit;

a sixth capacitor coupled between a first terminal of the fifth capacitor and the third LC tank circuit, the third LC tank circuit being coupled between the sixth capacitor and the reference potential node; and a seventh capacitor coupled between a second terminal of the fifth capacitor and the third LC tank circuit.

26. The filter circuit of claim 21, wherein the second LC tank circuit comprises:

a fifth capacitor in the series path between the first port and the second port of the filter circuit; and an inductor coupled in parallel with the fifth capacitor.

* * * * *